United States Patent [19]

Abraham et al.

[11] 4,449,282
[45] May 22, 1984

[54] ASSEMBLING COMPONENTS SUCH AS LIDS TO CHIP ENCLOSURES

[75] Inventors: Bruce C. Abraham, Limekiln; Charles R. Fegley, Laureldale; Jerry C. Hurst, Reading, all of Pa.

[73] Assignee: AT&T Technologies, Inc., New York, N.Y.

[21] Appl. No.: 409,381

[22] Filed: Aug. 18, 1982

[51] Int. Cl.³ .............................................. B23Q 7/00
[52] U.S. Cl. ...................................... 29/467; 29/743; 29/744; 29/773; 29/809; 228/6 R; 414/222; 414/737
[58] Field of Search ................. 29/467, 464, 809, 810, 29/743, 744, 771, 773, 786; 414/222, 737; 198/420; 228/6 R, 6 A

[56] References Cited

U.S. PATENT DOCUMENTS

| | | |
|---|---|---|
| 3,272,350 | 9/1966 | Pflaumer et al. |
| 3,390,450 | 7/1968 | Checki, Jr. et al. ............... 29/464 X |
| 3,460,217 | 8/1969 | Leistner .............................. 29/809 X |
| 3,843,036 | 10/1974 | Monahan et al. ................... 228/6 A |
| 3,881,082 | 4/1975 | Pasquale et al. ................... 29/467 X |
| 3,977,539 | 8/1976 | Hauschild . |
| 4,102,481 | 7/1978 | Ollenbach ......................... 29/743 X |
| 4,141,457 | 2/1979 | Nocek . |
| 4,292,116 | 9/1981 | Takahashi et al. |

Primary Examiner—Kenneth J. Ramsey
Attorney, Agent, or Firm—D. C. Watson

[57] ABSTRACT

First components such as lids (9) are assembled to second components such as electronic chip carriers (10). Each lid (9) has an external surface opposite a first mating face and each carrier (10) has a second mating face complementary with the first mating face of the lid (9). An assembly station contains a first frame (30) having first walls (31-35) for confining and first ledges (37-38) for supporting a lid (9). Frame (30) has an advantageous peripheral opening (39) suitable for passing therethrough portions of devices for transferring lids (9). Preferably such stations (25) are established in an array suitable for access by an array of lids (9) transferred by a first device (35). A first magazine (70) holds files of lids (9) with external surfaces of leading ones in an array for contact, pickup and transfer. The first device (55) has a plurality of fingers (62) with vacuum pickup portions (64) presenting an array of faces (66) to contact and pickup an array of lids (9) from the first magazine (70) and for releasably retaining the same. Device (55) is moved along a path to the first frame (30) and the fingers (62) pass therethrough in an inverted manner. Thus an array of lids (9) are transferred into the frames (30) in a preferably flat orientation with mating faces turned upward. An escapement (105) is then preferably actuated to permit a second magazine to guidably deliver an array of leading carriers (10), with mating faces downward upon the upturned lids (9).

10 Claims, 6 Drawing Figures

ASSEMBLING COMPONENTS SUCH AS LIDS TO CHIP ENCLOSURES

TECHNICAL FIELD

This invention relates to assembling components such as lids to chip enclosures. More particularly, this invention relates to assembling a lid to a larger, top side of an enclosure adapted to electrically connect elements such as chips containing miniature electronic circuits to external service connections.

BACKGROUND OF THE INVENTION

Adapting elements such as, for example, integrated circuit chips (ICs) for service is a major undertaking in the electronics industry. Sometimes such chips are mounted directly upon a substrate and electrically connected to a circuit thereon, the substrate being a part of a circuit pack. More often today, a chip is mounted either alone or with other elements in an enclosure having a system of conductors including external leads or pads for connection to sockets or circuit substrates. The enclosure may take many forms including a partial enclosure, a fully enclosed plastic or glass encapsulation or a container which may be hermetically sealed. Such enclosures serve, inter alia, to protect the chip and other elements from moisture, corrosion and physical abuse.

Most containers which are designed to be fully enclosed have constructed thereon a seat to receive a component such as a lid, usually on an accessible topside portion utilized to install the chip and other elements. Sometimes the seat may be lined with solder or other bonding material, although quite often the seat is made complementary with a mating face on the lid. The seat is metallized and the bonding material is adhered to the lid. Generally, the seat is made slightly smaller than the topside surface of an enclosure so the seat outline can be more precise than the outline of the topside. Also, the lid is often made smaller than the seat so a fillet of bonding material may be developed about the periphery of an installed lid and such fillet is adhered to peripheral portions of the seat to effect a good seal.

Modern electronic chips are generally very small and may contain thousands of devices in a miniature circuit thereon to achieve high speed performance at low costs. Accordingly, the enclosures are also kept small to enhance performance between chips and/or other elements in service and for efficient utilization of space on service substrates. Consequently, the assembly of such enclosures is a problem because of the smallness and/or differences in size of the components and the sometimes tedious procedures associated with registering one component precisely with another. It is especially a problem to assemble such enclosures when components are adapted for special bonding, for example, when hermetic sealing is to follow such assembly.

For the above and other reasons, it is desirable to provide new and improved expedients for assembling one component to another, especially when such components are small in size. It is also desirable to assemble a small component which is light in weight and has a delicate mating face to another component which is somewhat larger and includes a larger mating face. Such assembly should have precise registration of the mating faces, particularly when adaptations are made to effect tight bonding such as, for hermetic sealing. To meet competition, it is also desirable that such expedients be reliable, repeatable and amenable to low cost assembly via mechanization or at least semiautomation.

SUMMARY OF THE INVENTION

The present invention embodies expedients for assembling components including at least one first component such as a lid having an external surface located opposite a first mating face. Such a first component is assembled to at least one second component such as a chip enclosure having a second mating face complementary with and joinable to the first mating face of the first component. At least one assembly station is established containing a first positioning frame having first walls for confining and first ledges projecting therefrom for supporting a first component. The first frame advantageously has a peripheral opening suitable for passing therethrough portions of transfer devices associated with assembling the components. Suitable expedients hold, at a desired location, at least one first component with its external surface exposed for contact, to pick up and transfer such component to the assembly station. The first components are transferred by expedients including at least one finger having a mechanism proximate a free end thereof which contacts the external surface, picks up a first component and releasably retains the same. By such expedients, transfer of a first component occurs along a path between the location for holding to pick up the first component to and below the first positioning frame. The finger passes through the frame in an inverted manner and transfers, with its mating face turned upward, a first component upon the first ledges, confined by the first walls of the first frame. Other expedients then guidably deliver to the assembly station a second component with its mating face turned downward and in registration with the first mating face of a first component to thereby assemble the first and second components.

In another embodiment, an assembly of first and second components is transferred from the assembly station to subsequent operations such as storage or shipping or a furnace for sealing. The embodiment includes at least one clamping portion having first and second resiliently extending members which are restrained at fixed ends and are biased to a normally closed condition at free ends sufficiently to hold therebetween the assembly of first and second components. A mechanism is utilized to reverse bias the free ends of the clamping members sufficiently apart in an open condition to release one assembly and to engage therebetween another assembly for clamping and transfer of the same. The clamping portion passes in the open condition into the assembly station for clamping and upwardly therethrough in the closed condition for transferring from the station the assembly of first and second components.

BRIEF DESCRIPTION OF THE DRAWINGS

The invention will be more readily understood from the following detailed description when read in conjunction with the accompanying drawing, wherein.

It can be seen that some elements in the figures are abbreviated or simplified to highlight certain features of the invention. Also, where appropriate, reference numerals have been repeated in the figures to designate the same or corresponding features in the drawing.

DETAILED DESCRIPTION

The Components

Figure 1:
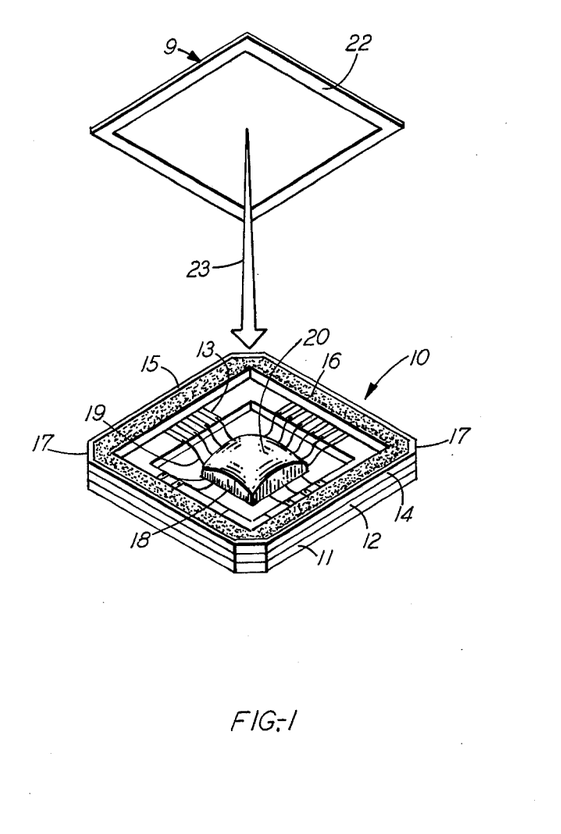
FIG. 1 is an exploded view of a common type of chip enclosure which is advantageously assembled in the practice of the present invention.

FIG. 1 illustrates a first component 9 and a second component 10 which are assembled in the practice of the invention. For purposes of illustration and discussion, the second component will also be referred to herein as an electronic element enclosure 10 or as a chip carrier 10. However, the invention should not be understood as referring only to such enclosures or only to electronics work. It is believed that the invention is reasonably applicable to a broad range of components having mating faces which require registration for assembly.

The first component 9 will also be referred to for illustration and discussion as a seat covering 9 or merely as a lid 9. Enclosures for electronic elements take on many forms in industry and they may or may not be fully enclosed. Also, they are not always fully enclosed by utilizing another component such as a lid 9. For example, the enclosure 10 may accommodate an electronic element for service connection with a molding type material encapsulating the elements within enclosure 10 and without the necessity for a lid 9. Of course, when a tight seal is required on an enclosure 10 such as for hermetically sealing the enclosure, a lid may be utilized. Consequently, the second component is often referred to alone as an enclosure 10 or a carrier 10, whether or not a lid 9 is attached thereto.

The second component 10, as illustrated in FIG. 1, further seems to be accorded a special status in the art. For example, it is most often referred to as a chip carrier 10 which typically accommodates a single chip rather than several chips or a chip and other active or passive elements. However, it will be utilized for illustration and discussion because of its relative simplicity and not because it is the only enclosure of electronic elements amenable to the practice of the invention.

Carrier 10 is often constructed of three layers of ceramic material enclosing a system of metallized conductors. For example, a bottom layer 11 may have an array of metal pads (not shown) for connection to contacts on a service substrate. A next higher layer 12 may be a frame supporting an array of internal metal contacts 13 which are directly connected to the unseen bottom pads. A top layer 14 may be a frame having a topside 15 supporting a carefully constructed metallized seat 16. The carrier 10 shown has four chamfered corner portions 17, to avoid snagging to irregular features in magazines for handling the individual layers 11–13 or the constructed carriers 10. It will also be seen that the seat 16 is formed within the edges of the topside 15. Accordingly, seat 16 may be more precisely outlined and have a more controlled topography than the ceramic topside 15.

Within carrier 10, an electronic chip 18 has been mounted, typically by bonding to a metal contact (not shown) formed into the bottom layer 11. From the chip 18, a plurality of wires 19 extend and are typically bonded to the internal contacts 13. After the wires 19 are bonded, a layer 20 of room temperature vulcanized (RTV) silicone rubber is often applied to the chip 18 to protect it from moisture and other hazards.

The lid 9, shown in FIG. 1, is generally made of metal and is smaller in outline than the topside 15 of carrier 10. Solder may be separately applied between lid 9 and seat 16 or, more advantageously, a frame 22 of solder may be attached to lid 9 as shown. When lid 9 is bonded to seat 16 of topside 15 the bonding material is typically squeezed out along the edges of lid 9 and forms a fillet thereabout. Such a fillet is advantageous to good bonding and is particularly helpful when there is a peripheral seat portion extending slightly beyond lid 9 and under the fillet. Also, it is advantageous to avoid having bonding material flow over the topside 15 of the enclosure 10.

Consequently, it is known in the art to have the seat 16 smaller than the topside 15 and to have the lid 9 smaller than the seat 16. All such relative sizes are measured transversely of the items when the lid 9 is bonded in place. However, the lid 9, the carrier 10, the topside 15 and the seat 16 are all very small in size and weight.

For example, the carrier 10 may be about 0.400 inch square by about 0.080–0.090 inch high and weigh about grams. The seat may be about 0.360 to 0.380 inch in length or width. The lid 9 may be about 0.350 to about 0.360 inch square by about 0.010 inch thick and weigh about grams.

From the above, it is apparent that the components are small and the lid 9 is quite different in size and weight from the carrier 10. Therefore, it is a difficult task to manipulate the components and to center the lid 9 precisely upon the seat 16. Such assembly is further complicated when a solder frame 22 is utilized because it is somewhat delicate and vulnerable to abuse. It is good practice in handling lid 9 to contact only the external surface (not shown) which is opposite the mating face shown in FIG. 1. The mating face for lid 9 is readily recognized and for purposes of description will be defined by the edges of lid 9 because registration is best made by reference to such edges to achieve good bonding. However, registration of lid 9 to carrier 10 is best made by reference to seat 16 rather than topside 15. For good bonding such registration is best made by centering the lid 9 on seat 16 (as explained hereinabove) thus permitting an irregular peripheral portion of seat 16 to be exposed prior to bonding. However, most of seat 16 is thus covered by lid 9 so the mating face for component 10 will be described herein as substantially defined by the seat 16.

Assembling Components

As can be seen from FIG. 1, carrier 10 is normally oriented in an upright manner because topside 15 is accessible to install elements, do wire bonding and apply protective coatings such as RTV material. Consequently, it is conventional to install lid 9 according to arrow 23 as a natural next step after installing chip 18 and also because centering lid 9 upon seat 16 is readily observed when carrier 10 is upright. However, it has been found that the assembly of lid 9 to carrier 10 is advantageously performed according to method and means depicted in FIG. 2. Although many features shown in FIG. 2 may be singular entities, they are taken from FIGS. 3 and 4 which depict arrays of such features.

Figure 2:
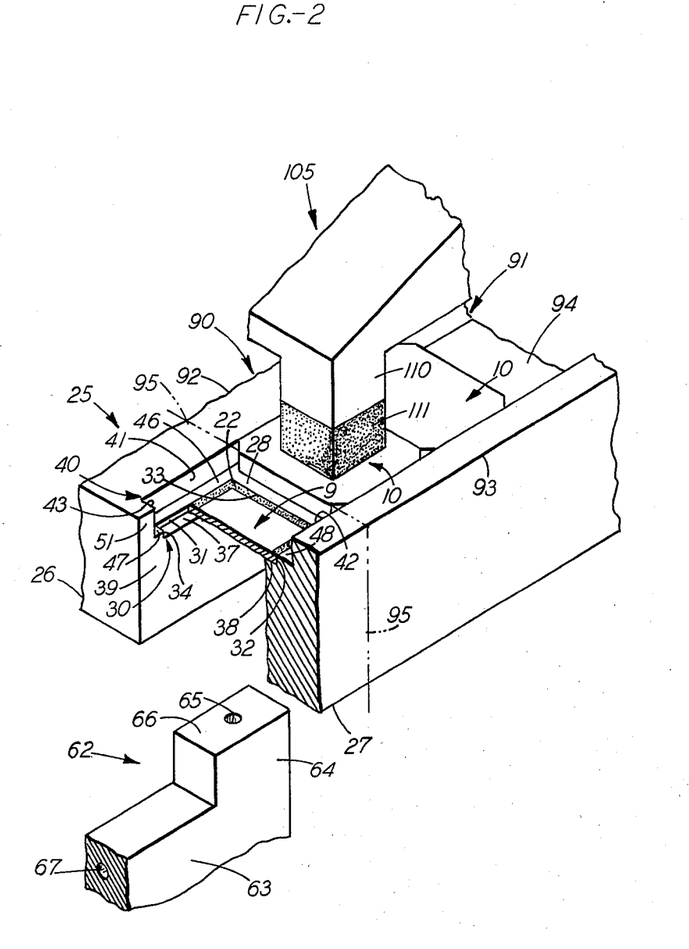
FIG. 2 is a pictorial view of a station for assembling a small, first component such as a lid to a larger, second component such as a chip enclosure in the practice of the invention.

An assembly station 25 is shown including side members 26 and 27 joined together by a floor portion 28. Station 25 has a positioning frame 30 which includes opposite walls 31 and 32 in side members 26 and 27, respectively. A back wall 33 is formed partly in side member 26, partly by a cut end of floor 28 and partly in side member 27 (only the top edge of wall 33 is seen in FIG. 2). At the front of station 25, short walls 34 and 35 are formed in side members 26 and 27, respectively, but wall 35 cannot be seen because a front portion of member 27 is cut away for clarity of description. Frame 30 also includes opposite ledges 37 and 38 formed in members 26 and 27, respectively.

As can be seen, walls 31-35 are for confining and ledges 37-38 are for supporting a first component such as a lid 9 (only a portion is shown). Moreover, frame 30 positions lid 9 in a precise manner with little tolerance between the edges of lid 9 and walls 31-35. Consequently, lid 9 should be transferred into frame 30 with an initially controlled orientation. To effect such transfer, frame 30 has a front opening 39 so a transfer device may extend therethrough to deliver lid 9 downwardly upon the ledges 37-38 and land the four corners of lid 9 at about the same instant within the confines of walls 31-35.

FIG. 2 illustrates the condition in which a lid 9 has been transferred into frame 30 and positioned therein in an unconventional manner, i.e., it is inverted so its mating face is turned upward as can be seen by reference to the frame 22 of bonding material on lid 9. Such disposition of lid 9 has been found advantageous for a number of reasons. For example, lid 9 has a delicate mating face so the lid is best handled by contacting only its external surface (not shown) which is opposite the mating face. Accordingly, opening 39 permits lid 9 to be landed flatly in frame 30 and the opening permits a transfer device to continue its motion downwardly and away from station 25 so a subsequent transfer of a second component onto lid 9 can occur without interrupted motion.

Also, if the second component is slightly smaller or about the same size as the inverted first component, frame 30 permits excellent visual access for positioning a second component thereon and centering the same. Of course, the height of walls 31-35 are advantageously selected to permit whatever tolerance is desired between the first and second component. For example, a separate frame of solder or a separate application of an adhesive may be applied to lid 9. Frame 30 and the upturned mating face of lid 9 provide suitable access therefore and the height of walls 31-35 may be set to accommodate such application.

The height of walls 31-35 may also be set deep enough to accept a second component within such first walls, with a mating face turned downward if the topside of the second component is equal to or smaller than lid 9. In that case frame 30 acts as a positioning frame for both first and second components. Also, if the second component has a recess in its topside to receive lid 9, the walls 31-35 may be set so the lid 9 protrudes above floor 28 and the second component may be slidably positioned over the first component without separate positioning expedients.

Station 25 may advantageously be established with a second positioning frame 40 located above the first positioning frame to assemble a typical chip carrier 10 to a lid 9. Such a second frame is presently preferred when a second component is larger than the first component measured transversely of the mating faces. The second frame is also preferred when there is an absence of significant features associated with one or both mating faces which would cooperate in registering the components. Of course, the second positioning frame 40 is more readily preferred when the side surfaces of a second component are smooth and regular and bear a tolerable spatial relationship with the mating faces. For example, the side surfaces of a typical carrier 10 are generally smooth and substantially parallel or at right angles to one another. Also, the width of seat 16 is substantially uniform and generally formed with acceptable centering within topside 15. Therefore, the side surfaces of carrier 10 may advantageously serve as reference surfaces in the assembly operation.

Frame 40 includes walls 41 and 42 formed in side members 26 and 27, respectively. Also, included are front wall portions 43 and 44, in side members 26 and 27, respectively, although wall 44 is not seen in FIG. 2 because of the cut away technique. Frame 40 further has ledges 46 and 47 formed in side member 26 and ledges 48 and 49 formed in side member 27, although ledge 49 is also unseen because of the cutaway. It will be appreciated that walls 41-44 are for confining and ledges 46-49 are for supporting a second component with its mating face turned downward upon the upturned mating face of the first component.

Expedients are further required to transfer a second component into frame 40 with a properly controlled orientation and a presently preferred expedient will be explained hereinafter. However, for observing registration of mating faces and for versatility of transfer devices a peripheral front opening 51 is advantageously provided which is similar to and complementary with opening 39 in frame 30. Opening 51 permits a second component to be delivered into frame 40 with all corners landing at about the same instant in time. Openings 39 and 51 cooperate to permit an assembly of first and second components to be readily clamped together by a tweezer type tool and removed upwardly from station 25 for transfer to a subsequent operation.

Transferring the Components

In one embodiment of the invention, a first component such as a lid 9 is transferred from a desired holding location to the first positioning frame 30. Such holding for pickup and transfer may be done by merely placing a lid 9 with its mating face downward upon a base location such as a supply magazine 70 (FIG. 3) or a table (not shown). Thus, the external surface is exposed for contact to pickup and transfer the same to the assembly station 25.

A first device (not fully shown in FIG. 2) for transferring such a first component includes at least one finger designated by the numeral 62. Finger 62 has a freely extending portion 63 and an attraction mechanism proximate a free end for contacting the external surface to pick up a first component and for releasably retaining the same. If a lid 9 is magnetically attractive, a magnetic mechanism may be utilized. However, it is presently preferred to use a vacuum powered attractive mechanism. Accordingly, the freely extending portion 63 has a pickup portion 64 extending from its side in an upward manner as shown in FIG. 2 and ending in a surface 66 having a vacuum port 65 from which air is drawn through a passageway 67 by expedients (not shown).

For transferring, the device with finger 62 is moved along a path from the location for holding to pick up the first component to and below the positioning frame 30. It will be appreciated that when finger 62 is utilized for pickup, the portion 64 then extends in a normally downward manner to contact a first component. Accordingly, the orientation of finger 62 and particularly its pickup portion 64 is considered to be inverted in FIG. 2. The finger 62 passes downwardly through frame 30 in the inverted manner by cooperation with opening 39 and the first component is stripped from pickup portion 64 and its face 66 when the component contacts and is supported by ledges 37–38. The mating face is turned upward and the downward movement of finger 62 precisely positions the first component within the confines of walls 31–35.

According to the illustrative embodiment there is next guidably delivered to the assembly station 25, a second component with its mating face turned downward and in registration with the first mating face of the first component. It will be appreciated that there are many ways to deliver the second component in the manner described depending upon the size and weight of the second component, the precision with which registration is to be made and the features of its mating face. Most of these considerations have been discussed hereinabove. For example, if the second component is the carrier 10, it may be delivered upon a lid 9 by utilizing a hand tool such as a tweezers with or without the second positioning frame 40.

Another method of guidably delivering a second component utilizes a portion of a magazine 90, shown in FIG. 2 which is in direct communication with the assembly station 25. A channel 91 includes side members 92 and 93 which are advantageously made an integral part of side members 26 and 27, respectively, and a floor 94 made an integral part of floor 28. All such integral parts are separated for discussion herein by a theoretical plane 95. Channel 91 may be inclined downwardly toward station 25 such that a carrier 10 deposited in channel 91 with its mating face downward is delivered directly upon the lid 9. If a second component has features on its mating face to center itself upon a first component or if rough registration is acceptable, a second positioning frame 40 may not be justified. However, given the carrier 10 previously described for the second component, it is advantageous to have channel 91 in direct communication with frame 40 for precise registration.

It is incidentally seen in FIG. 2 that an escapement 105 having an arm 110 may be utilized to control a file of carriers 10 in channel 91. Arm 110 has a pad 111 and such arm is spring loaded in a downward manner as will be explained later. Arm 110 controls the file of carriers 10 by releasing a lead carrier when required and merely biasing pad 111 upon the next trailing carrier 10 and thence to floor 94.

Arrays of Components

Figure 3:
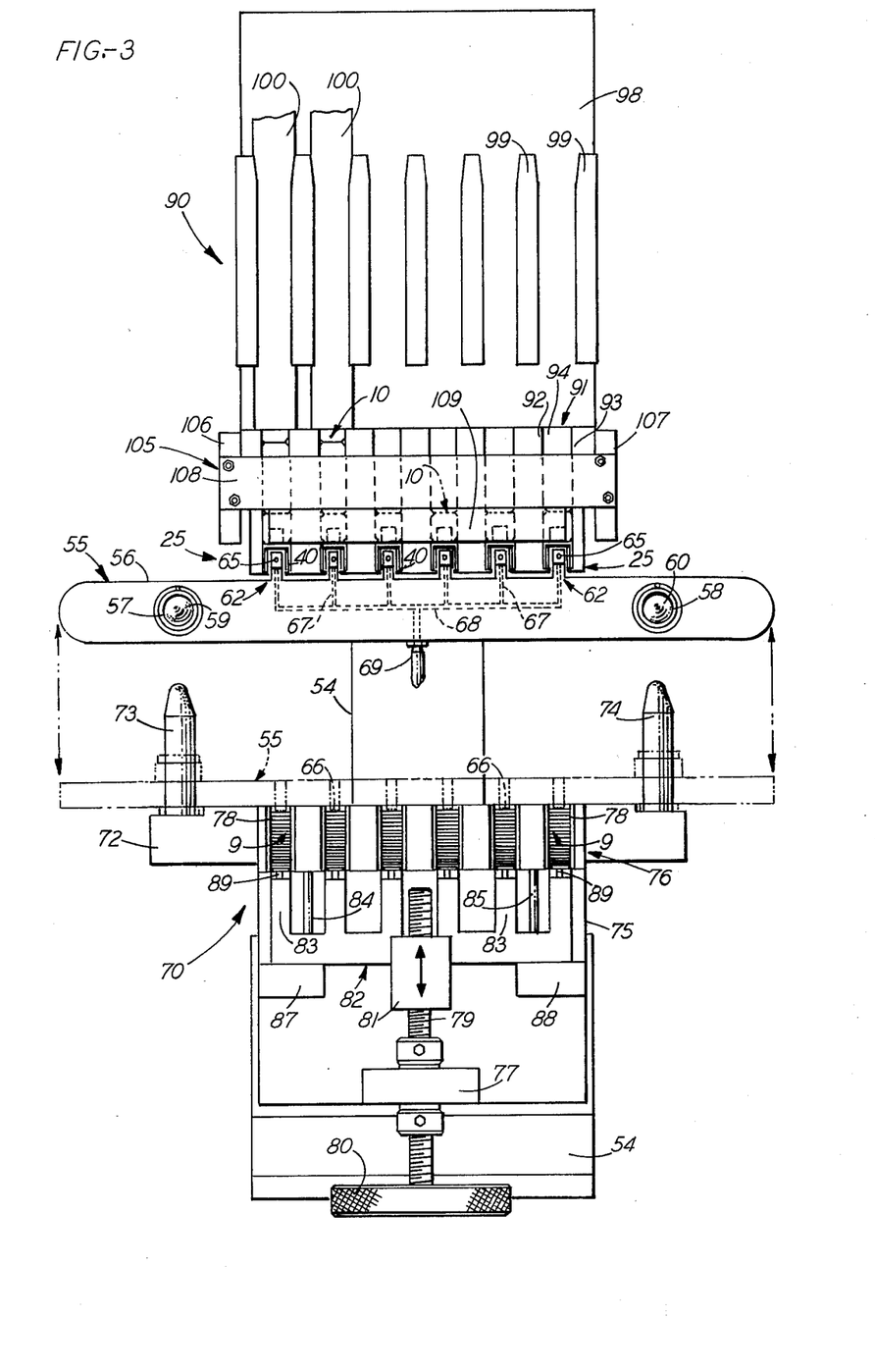
FIG. 3 is a front view of an array of assembly stations, a first transfer device for handling first components, a first magazine for holding lids, and a second magazine for delivering enclosures to the assembly stations.
Figure 4:
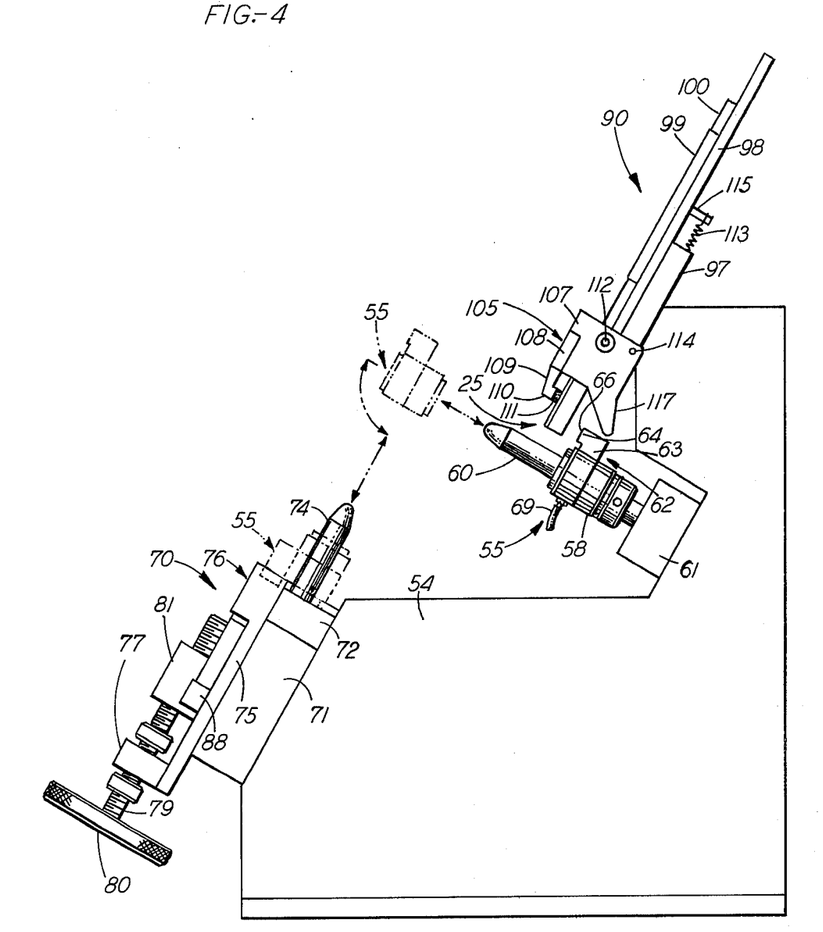
FIG. 4 is a side view of the apparatus shown in FIG. 3.

FIGS. 3 and 4 are front and side views, respectively, of apparatus for assembling arrays of first and second components. FIG. 4 shows a base stand 54 supporting an array of the assembly stations 25, a first transfer device 55 for handling first components, a first magazine 70 for holding lids 9 and a second magazine 90 for delivering carriers 10 to the assembly stations 25.

FIG. 3 shows the array of assembly stations 25 wherein a plurality was selected consistent with a desire to expedite assembly and to attain low costs. The particular array was selected for access to all stations 25 substantially simultaneously by portions of transfer devices to be described.

The first transfer device 55 is for handling an array of first components, such array being complementary with the array of assembly stations 25. Device 55 includes an elongated member 56 having two apertures with guide collars 57 and 58 installed therein shown located over members 59 and 60, respectively, which are supported by a laterally extending member 61 attached to the base stand 54 (FIG. 4). A plurality of fingers 62 are shown, each having an end affixed along a common side of member 56 and a portion 63 (FIG. 4) extending from such side to a respective free end. A pickup portion 64 is proximate each free end extending from a common side of each finger extension 63. A vacuum port 65 is included in a face 66 common to each respective pickup portion 64. A passageway 67 (FIG. 3) in each finger 62 connects to a distribution manifold 68 and a tube connection 69 is made therefrom to a vacuum source (not shown).

The fingers 62 described herein are arranged so the pickup faces 66 are disposed in an array complementary to the array of stations 25 and to an array of first components held for pickup in a manner to be described.

As best seen in FIG. 4, the first magazine 70 has a support block 71 affixed to stand 54 and a laterally extending portion 72 to support members 73 and 74 (FIG. 3) for locating transfer device 55. Affixed to block 71 is a plate 75 having a lid guide section 76 and a journal portion 77.

Section 76 has formed therein a plurality of channels 78 (FIG. 3), each for holding a single file of lids 9 having external surfaces turned toward a free end of a respective channel. A leading first lid 9 of each file has its external surface exposed for contact with a respective face 66 of a finger 62 as shown in phantom lines. The plurality of channels 78 are arranged to have a resultant plurality of leading lids 9 with external surfaces disposed in at least one array complementary to the array of assembly stations 25.

The journal portion 77 has a threaded rod 79 extending therethrough to index, as required, the files of lids 9 in the channels 78. Rod 79 has a knurled hand wheel 80 on a lower end and is threaded into a movable block 81 at an upper end. Block 81 is attached to and moves a yoke 82 having pusher portions 83 which extend into the channels 78. Two rods 84 and 85 are dowelled in section 76 for guiding and two stops 87 and 88 are affixed to plate 71 to limit the downward travel of yoke 80.

It will be appreciated that a certain amount of force is exerted by the fingers 62 upon leading lids 9 in the files which could cause injury to features such as to the solder frames 22 on leading or trailing lids. Consequently, the files of lids 9 are resiliently held by spring biased plungers 89 in the channels 78. Also, by slight rotation of handwheel 80 between each pickup cycle there will be resultant upward movement of indexing items 81–83. Such movement assures that the leading first lid 9 in each file of the array will be maintained substantially along a common plane. Such maintained disposition assures substantially simultaneous contact of the external surfaces to the fingers 62 of device 55 and improved pickup and transfer of an array of lids 9.

A second magazine 90 is shown in FIGS. 3 and 4 for guidably delivering ones of a second component such as a carrier 10 to a respective assembly station 25. Magazine 90 has a plurality of channels 91 each inclined downwardly toward and in direct communication with a second positioning frame 40 of an assembly station 25. Each channel 91 is adapted to hold, by supporting the same on their mating faces, a single file of second components such as carriers 10. A channel 91 slidably delivers successive ones of the carriers 10 to a second frame 40 such that a mating face of a respective carrier contacts and registers with the mating face of a first component such as a lid 9. Items 92–94 which form a respective channel 90 have previously been explained with relation to FIG. 2.

By reference to FIG. 4 it is seen that magazine 90 and the assembly stations are affixed to base stand 54 by a support block 97 and a plate 98. On top of plate 98 and adjacent the channels 90, there are shown a plurality of guides 99 for releasably securing portable carrier holders 100 (only two are shown in FIG. 3). Such holders are generally made of plastic and are about 18 to 24 inches long with a longitudinal slot facing downward upon plate 98. Holders 100 provide a convenient method of storing and carrying carriers 10 and they are often referred to in the art as "stick" holders or magazines. When slipped between guides 99 and with a downward end open, the holders 100 deliver carriers 10 into channels 91 in the manner described for operation of magazine 90.

For suitable successive assembly of lids 9 to carriers 10 an escapement mechanism 105 is provided which was previously alluded to in FIG. 2 and more fully shown in FIGS. 3 and 4. Escapement 105 is associated with magazine 90 for controlling downward sliding advancement of each file of carriers 10. Escapement 105 successively releases from each file a leading carrier 10 after a lid 9 is transferred into each first frame 30.

Escapement 105 is primarily supported by two end plates 106 and 107 and a connective plate 108 as best shown in FIG. 3. A downward sloping portion 109 of plate 108 supports a succession of depending arms 110 and pads 111 as best seen in FIGS. 2 and 4. As further seen in FIG. 4, each end plate such as plate 107 is pivotally attached to plate 98 by a pin 112. Plate 107 is biased in a counterclockwise direction by a spring 113 attached to plate 107 by a pin 114 and to plate 98 by a pin 115. In a similar manner the opposing end plate 106 is pivotally attached to plate 98 and biased in a counterclockwise direction by a similar spring (not shown in the figures). End plates 106 and 107 are manually operable by slightly rotating the same in a clockwise direction against the spring bias by triggers such as a trigger portion 117 of plate 107 shown in FIG. 4.

Assembling Arrays of Components

In operation the first transfer device 55 is activated by opening a valve (not shown) to apply vacuum through tube connection 69, manifold 68, the passageways 67 and the ports 65, all as shown in FIG. 3. The transfer device 55 is moved upwardly along and above the locating pins 59 and 60 and is turned about 90 degrees toward the first magazine 70 as seen in phantom lines in FIG. 4. Member 56 is positioned so that guide collars 57 and 58 engage and slide along locating pins 73 and 74 until device 55 takes the position shown in phantom lines in FIG. 3. Pickup faces 66 contact external faces of lids 9 and the vacuum therebetween causes a leading lid 9 to be releasably retained on each face 66. Wheel 80 may be rotated slightly clockwise to urge the lids 9 upwardly in the channels 78.

The device 55 is then moved outwardly along and away from locating pins 73 and 74 and is turned about 90 degrees away from first magazine 70 toward the assembly stations 25 (FIG. 4). Member 56 is positioned so guide collars 57 and 58 engage and slide downwardly along locating pins 59 and 60. By such motion the fingers 62 and particularly portions 63–66 pass downwardly through the array of stations 25, their openings 50 and 39 and the frames 40 and 30. The array of lids 9 are thereby stripped from the fingers 62 and landed upon the frames 30.

The triggers on end plates 106 and 107 are then slightly lifted to actuate escapement 105 and lift the pads 111 from leading carriers 10 in the channels 91 shown in FIG. 3. Such leading carriers 10 are guidably delivered by the force of gravity into the frames 40 of the assembly stations 25. The trailing carriers 10 are halted by the leading carriers stopping in the frames 40 whereupon the escapement is released and the springs such as spring 113 bias the pads 111 downward upon the trailing carriers 10. The assemblies are completed and ready to be clamped and transferred.

Clamping Assemblies

As has been explained with regard to a basic embodiment shown in FIG. 2, an assembly of first and second components is readily removed from an assembly station 25 by a conventional tweezers. An array of assemblies is also readily removed by a second transfer device 125 which will now be described.

Figure 5:
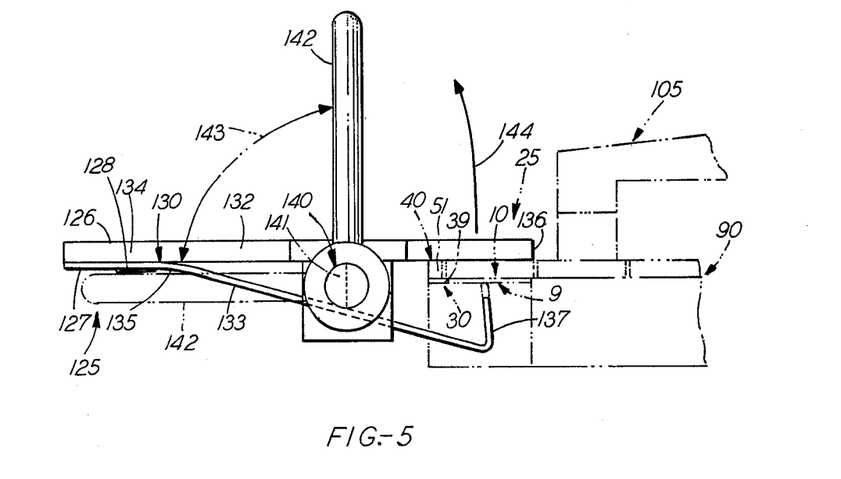
FIG. 5 is a side view of a device for clamping and transferring an assembly of components such as a lid and a chip enclosure from the assembly station to a subsequent operation.

FIG. 5 is a side view of the second device 125 shown clamping at least the end assembly of an array of assemblies and for transferring the same from the array of assembly stations 25 to a subsequent operation. Although such subsequent operation may involve storing or shipping, it is more likely to be a reflow bonding operation where the assemblies are traversed through a furnace. Therefore, the device 125 should tolerate sustained, elevated temperatures.

Figure 6:
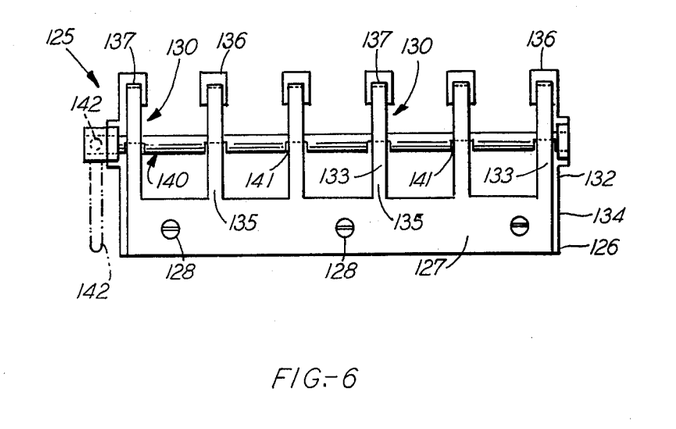
FIG. 6 is a bottom view of the device shown in FIG. 5.

FIG. 6 is a bottom view of the device shown in FIG. 5 wherein a plurality of clamping portions 130 are seen. Referring to both FIGS. 5 and 6 the device 125 includes a heavy steel plate 126 and a lighter weight steel plate 127 which have been hardened to acquire spring temper. Plates 126 and 127 have been cut as shown and fastened together, for example, by screws or spot welds at points 128. Each clamping portion 130 includes a pair of first and second resiliently extending members 132 and 133 having fixed ends 134 and 135, respectively. Member 133 of each portion 130 is shaped as shown in FIG. 5 to obtain a bias between the pair of members 132 and 133. Contrary to what is shown in FIG. 5, members 132 and 133 are biased such that free ends 136 and 137, respectively, are in a normally closed condition. The bias is sufficient to securely hold therebetween an assembly of components such as an assembly of a lid 9 and a carrier 10.

FIG. 5 shows the device 125 in a position just prior to clamping an end assembly of an array of assemblies. Therefore, the clamping portion 130 shown is in an open condition obtained by reverse biasing free ends 136 and 137 sufficiently apart to release one assembly or to engage therebetween another assembly. The reverse biasing is accomplished by a shaft 140 extending longitudinally between each member 132 and 133 in the array thereof. A series of notches 141 are formed in shaft 140 to normally permit members 133 to be disposed therein when the clamping portions 130 are closed and an end crank arm 142 is normally in the position shown in phantom lines in FIGS. 5 and 6. To open the clamping portions 130 the crank arm 142 is rotated clockwise about 90 degrees as shown by arrow 143 in FIG. 5. Members 133 then ride outwardly upon the solid portions of shaft 140 at the notches 141 and ends 136 and 137 are reverse biased as shown to open all portions 130 in a simultaneous manner.

Free ends 136 advantageously are made sufficiently wide to accommodate a carrier 10 and prevent it from turning during clamping. Each free end 137 has a portion turned toward a lid 9 to contact it in a knife edge manner to concentrate pressure at about the center of such lid.

It will be appreciated that peripheral openings 51 and 39, respectively, in frames 40 and 30, advantageously permit members 132 and 133 to clamp ends 136 flatly and ends 137 as shown upon the components. Device 125 is movable such that the openings 51 and 39 also permit clamping portions 130 to pass in the open condition into assembly stations 25 for clamping and upwardly therethrough (as shown by arrow 144) in the closed condition for removal. While securely clamped, the assemblies of first and second components are thus transferred to subsequent operations.

Mechanization

While the above description is made primarily with respect to a semiautomatic operation, it will be appreciated that the invention does lend itself to further mechanization. For example, the first device 55 could readily be manipulated from the first magazine 70 to the assembly stations 25 by robotic arms which are programmable. Also, the second device 125 could be manipulated by overhead arms which are also programmable. In another embodiment, the first magazine 70 and the assembly stations 25 could be located on the same side of a track and the first device 55 could be indexed back and forth along the track. It is believed that one of ordinary skill in the art could implement such mechanization with little, if any, experimentation.

There have been illustrated herein certain embodiments of the invention and certain applications thereof. Nevertheless, it is to be understood that various modifications and refinements may be made and used which differ from these disclosed embodiments without departing from the spirit and scope of the present invention.

What is claimed is:

1. Apparatus for assembling at least one first component having an external surface opposite a first mating face to at least one second component having a second mating face complementary with and joinable to the first mating face of the first component, comprising:
   at least one assembly station containing a first positioning frame having first walls for confining and first ledges projecting therefrom for supporting a first component, said frame having a peripheral opening suitable for passing therethrough portions of component transfer means associated with said assembling;
   means for holding at least one first component with its external surface exposed for contact to pick up and transfer the same to the assembly station;
   means for transferring at least one first component including at least one finger having means proximate a free end for contacting the external surface to pick up a first component and for releasably retaining the same, said transfer means being movable between the holding means and the first positioning frame along a path such that the finger passes through the peripheral opening in said frame in an inverted orientation and deposits the first component with its mating face turned upward upon the first ledges, confined by the first walls of said frame; and
   means, in communication with the assembly station, for guidably delivering thereto at least one second component with its mating face downward and in registration with the first mating face of a first component to thereby assemble the first and second components.

2. Apparatus as in claim 1, further comprising:
   means for transferring an assembly of first and second components from the assembly station, said means including at least one clamping portion having first and second resiliently extending members restrained at fixed ends and biased to a normally closed condition at free ends sufficiently to securely hold therebetween the assembly of first and second components;
   means associated with the transfer means for reverse biasing the free ends of the clamping members sufficiently apart in an open condition to release one assembly and to engage therebetween another assembly for clamping and transfer of the same; and
   said transfer means being movable such that the clamping portion passes in the open condition into the assembly station for clamping and upwardly therethrough in the closed condition for transferring from said station the assembly of first and second components.

3. Apparatus as in claim 1, wherein the second component has a peripheral seat thereon located within the edges of a top side of the second component, said seat substantially defining the second mating face, and the first component serves as a covering for the seat, said first component having the second mating face defined by edges of the first component and being smaller than the top side of the second component, at least when measured in a transverse direction common to the first component and the top side of the second component, and wherein the assembly station further comprises:
   a second frame located above the first frame for positioning the second component in a downward facing manner upon the upward facing first component, said second frame having second walls for confining and second ledges projecting therefrom for supporting said second component, there being a peripheral opening in said frame similar to and complementary with the opening in the first frame.

4. Apparatus as in claim 3, wherein the assembly station is one of a plurality of such stations disposed in an array suitable for access to all stations substantially simultaneously for the assembly of components at least by portions of associated transfer means.

5. Apparatus as in claim 4, wherein the means for holding at least one first component further comprises:

a first magazine having a plurality of channels, each for holding therein a single file of first components having external surfaces turned toward a free end of the respective channel, a leading first component of the file having its external surface exposed for contact with the pickup means of a respective finger for transferring such leading first component, said plurality of channels being arranged to have a resultant plurality of leading first components with external surfaces disposed in at least one array complementary to the array of assembly stations, and each single file of first components being resiliently held in a respective channel, the leading first component in each single file of an array being maintained along a common plane.

6. Apparatus as in claim 5, wherein the means for transferring a first component further comprises:

an elongated member supporting a plurality of fingers, each having an end affixed along a common side of the member and extending freely to an end of the respective finger, there being means proximate said free end on a common side of said fingers for contacting an external surface to pick up a first component and releasably retain the same, said pickup means being disposed in an array complementary to the array of external surfaces of leading first components held in the first magazine for such components; and means for supplying vacuum to a distribution manifold associated with the elongated member, said manifold being connected to a passageway in each finger extending to the pickup means for applying vacuum between such means and external surfaces of first components to pickup and releasably retain the same.

7. Apparatus as in claim 6, wherein the means for guidably delivering a second component further comprises:

a second magazine having a plurality of channels, each inclined downwardly toward and in communication with a second frame in the array of assembly stations and each channel adapted to hold, by supporting on their mating faces, a single file of second components for slidably delivering successive ones to a second frame such that a mating face of a respective second component contacts and registers with the mating face of a respective first component; and an escapement mechanism associated with the second magazine for controlling downward sliding advancement of each file and for successively releasing from each file a leading second component after a first component is transferred into each respective first frame.

8. A method of assembling at least one first component having an external surface opposite a first mating face to at least one second component having a second mating face complementary with and joinable to the first mating face of the first component, comprising:

establishing at least one assembly station containing a first positioning frame having first walls for confining and first ledges projecting therefrom for supporting a first component, said frame having a peripheral opening suitable for passing therethrough portions of component transfer means associated with said assembling;

holding at a desired location, at least one first component with its external surface exposed for contact to pick up and transfer the same to the assembly station;

transferring at least one first component by operating a first device including at least one finger having means proximate a free end for contacting the external surface to pick up a first component and for releasably retaining the same, said transfer occurring between the holding location and the first positioning frame along a path such that the finger passes through the peripheral opening in said frame in an inverted orientation and deposits the first component with its mating face turned upward upon the first ledges, confined by the first walls of the first frame; and guidably delivering to the assembly station, a second component with its mating face downward and in registration with the first mating face of a first component to thereby assemble the first and second components.

9. A method as in claim 8, further comprising:

transferring an assembly of first and second components from the assembly station by operating a second device including at least one clamping portion having first and second resiliently extending members restrained at fixed ends and biased to a normally closed condition at free ends sufficiently to securely hold therebetween the assembly of first and second components including the steps of:

reverse biasing the free ends of the clamping members sufficiently apart in an open condition to thereby release one assembly and engage therebetween another assembly for clamping and transfer of the same; and moving the second device such that the clamping portion passes in the open condition into the assembly station for clamping and upwardly therethrough in the closed condition for transferring from said station the assembly of first and second components.

10. A method as in claim 8, wherein the second component being assembled has a peripheral seat thereon located within the edges of a top side, said seat substantially defining the second mating face, and the first component serves as a covering for the seat, said first component having the second mating face defined by edges of the first component and being smaller than the top side of the second component, at least when measured in a transverse direction common to the first component and the top side of the second component, and wherein establishing the assembly station further comprises:

establishing a second frame located above the first frame for positioning the second component in a downward facing manner upon the upward facing first component, said second frame having second walls for confining and second ledges projecting therefrom for supporting said second component, there being a peripheral opening in said frame similar to and complementary with the opening in the first frame.

* * * * *